US009287328B2

(12) United States Patent
Suzuki

(10) Patent No.: US 9,287,328 B2
(45) Date of Patent: Mar. 15, 2016

(54) PHOTOELECTRIC CONVERSION DEVICE AND IMAGING DEVICE USING THE SAME

(71) Applicant: FUJIFILM CORPORATION, Tokyo (JP)

(72) Inventor: Hideyuki Suzuki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/536,221

(22) Filed: Nov. 7, 2014

(65) Prior Publication Data
US 2015/0060839 A1 Mar. 5, 2015

Related U.S. Application Data

(63) Continuation of application No. PCT/JP2013/002914, filed on May 2, 2013.

(30) Foreign Application Priority Data

May 10, 2012 (JP) .................................. 2012-108495

(51) Int. Cl.
H01L 31/062 (2012.01)
H01L 27/14 (2006.01)
H01L 31/0232 (2014.01)
(Continued)

(52) U.S. Cl.
CPC .............. *H01L 27/307* (2013.01); *B82Y 10/00* (2013.01); *H01L 51/4246* (2013.01); *H01L 51/4273* (2013.01); *H01L 51/442* (2013.01); *H01L 51/001* (2013.01); *H01L 51/0046* (2013.01); *H01L 51/0058* (2013.01);
(Continued)

(58) Field of Classification Search
CPC ... H01L 27/14; H01L 27/307; H01L 51/0032; H01L 51/0046; H01L 51/0047; H01L 51/0059; H01L 51/0072; H01L 51/424; H01L 51/4253; H01L 51/4273; H01L 51/442
USPC ........... 257/40, 290, 291, 414, 431, 432, 440, 257/451; 438/22, 24–29, 48, 82, 93
See application file for complete search history.

(56) References Cited

U.S. PATENT DOCUMENTS 8,592,931 B2    11/2013  Hayashi et al.
2006/0130893 A1*  6/2006  Gregg ........................... 136/263
(Continued)

FOREIGN PATENT DOCUMENTS

JP    2000-297068 A    10/2000
JP    2007-088033 A     4/2007
(Continued)

OTHER PUBLICATIONS

International Search Report; PCT/JP2013/002914; Jun. 25, 2013.

Primary Examiner — Hsien Ming Lee
(74) Attorney, Agent, or Firm — Studebaker & Brackett PC

(57) ABSTRACT

An organic photoelectric conversion device having a pair of electrodes and a light receiving layer which includes at least a photoelectric conversion layer and is sandwiched by the electrodes, the device including an electron blocking layer provided between the photoelectric conversion layer and one of the electrodes, and a hole blocking layer provided between the photoelectric conversion layer and the other of the electrodes, in which the hole blocking layer is a layer that includes a fullerene and/or a fullerene derivative and a transparent hole transport material having an ionization potential of 5.5 eV or more.

10 Claims, 3 Drawing Sheets

(51) Int. Cl.
*H01L 21/00* (2006.01)
*H01L 27/30* (2006.01)
*H01L 51/42* (2006.01)
*B82Y 10/00* (2011.01)
*H01L 51/44* (2006.01)
*H01L 51/00* (2006.01)

(52) U.S. Cl.
CPC ...... *H01L 51/0072* (2013.01); *H01L 2251/308* (2013.01); *Y02E 10/549* (2013.01)

(56) References Cited

U.S. PATENT DOCUMENTS

2007/0063156 A1    3/2007   Hayashi
2009/0078877 A1*   3/2009   Yaegashi et al. ......... 250/370.08
2010/0308311 A1*   12/2010  Mitsui et al. .................... 257/40
2014/0138667 A1*   5/2014   Hibino et al. .................... 257/40

FOREIGN PATENT DOCUMENTS

| | | |
|---|---|---|
| JP | 2007-123707 A | 5/2007 |
| JP | 2008-072090 A | 3/2008 |
| JP | 4213832 B2 | 1/2009 |
| JP | 2009-182095 A | 8/2009 |
| JP | 2009-182096 A | 8/2009 |
| JP | 2011-114215 A | 6/2011 |
| JP | 2012-019235 A | 1/2012 |
| WO | 2010/134432 A1 | 11/2010 |

* cited by examiner

PHOTOELECTRIC CONVERSION DEVICE AND IMAGING DEVICE USING THE SAME

CROSS-REFERENCE TO RELATED APPLICATIONS

This application is a Continuation of PCT International Application No. PCT/JP2013/002914 filed on May 2, 2013, which claims priority under 35 U.S.C. §119(a) to Japanese Patent Application No. 2012-108495 filed on May 10, 2012. Each of the above applications is hereby expressly incorporated by reference, in its entirety, into the present application.

BACKGROUND OF THE INVENTION

1. Technical Field

The present invention relates to an organic photoelectric conversion device having a photoelectric conversion layer formed of an organic layer and an imaging device equipped therewith.

2. Background Art

Imaging devices such as CCD sensors, CMOS sensors, and the like are known widely as image sensors used in digital still cameras, digital video cameras, cell phone cameras, endoscope cameras, and the like. These devices are equipped with a photoelectric conversion device having a light receiving layer which includes a photoelectric conversion layer.

Development of photoelectric conversion devices that use organic compounds and imaging devices using the same has been conducted by the present applicant, et al. The present applicant, at al. have filed a patent application for an organic photoelectric conversion device that uses a mixed layer (bulk hetero layer) of a p-type organic semiconductor and a fullerene or a fullerene derivative in a part of a light receiving layer with a view to improve the photoelectric conversion efficiency (sensitivity) (Japanese Unexamined Patent Publication No. 2007-123707).

According to Japanese Unexamined Patent Publication No. 2007-123707, an organic photoelectric conversion device having good photoelectric conversion efficiency (sensitivity) may be provided. Among the photoelectric conversion devices, light receiving devices used in the applications of sensors, imaging devices, and the like, the S/N ratio of photo current/dark current and response speed are important in the performance.

As a light receiving device that improves the photoelectric conversion efficiency (sensitivity) and the response speed without degrading the S/N ratio when an external voltage is applied, the present applicant, et al. have filed a patent application for an organic light receiving device which is an organic photoelectric conversion device that functions as alight emitting device (organic light emitting device) in which a charge blocking layer for preventing carrier (charge) injection from an electrode due to an external electric field is provide between the electrode and the organic photoelectric conversion layer (Japanese Unexamined Patent Publication No. 2007-088033).

Further, the present applicant, et al. have filed a patent application for an organic light receiving device that uses a layer of mixture of a fullerene or a fullerene derivative and an insulating material (Japanese Unexamined Patent Publication No. 2009-182095) or an organic light receiving device that uses a layer of mixture of a fullerene or a fullerene derivative and an electron transport material (Japanese Unexamined Patent Publication No. 2012-019235) in a hole blocking layer which is a charge blocking layer that suppresses hole injection from the electrode in the organic light receiving device of Japanese Unexamined Patent Publication No. 2007-088033 as a structure that may further provide a dark current suppressing effect.

Disclosure of the Invention

According to the structures of Japanese Unexamined Patent Publication No. 2009-182095 and Japanese Unexamined Patent Publication No. 2012-019235, a dark current suppressing effect may be obtained, but they have a problem that the response speed is slow and a residual image is likely to occur.

The present invention has been developed in view of the circumstances described above, and it is an object of the present invention to provide a photoelectric conversion device having a good sensitivity, a favorable S/N ratio of photo current/dark current, and a fast response speed. It is a further object of the present invention to provide a sensor and an imaging device equipped with the photoelectric conversion device.

As described in Japanese Unexamined Patent Publication No. 2009-182095 and the like, hole blocking layers are generally of a structure that includes a material having electron transportability with low hole transportability. In Japanese Unexamined Patent Publication No. 2012-019235, which is a patent document already filed by the present applicant, a hole blocking layer that includes a fullerene and/or a fullerene derivative and Compound 6 (ionization potential of 6.3 eV) described in a comparative example to be described later is used.

But, the present inventor has found out that, in a hole blocking layer that includes a fullerene and/or a fullerene derivative, the transport rate of carriers (holes) generated by the fullerene and/or the fullerene derivative in the hole blocking layer by absorbing incident light (visible light) is reduced within the hole blocking layer because the layer includes only an electron transport material, and the carriers reduce the response speed as the device and cause a residual image.

The present inventor has earnestly investigated the structures of hole blocking layers capable of satisfactorily suppressing hole injection from the electrode without reducing the transport rate of holes generated in the hole blocking layer within the layer, which has led to the present invention.

That is, a photoelectric conversion device of the present invention is an organic photoelectric conversion device having a pair of electrodes and a light receiving layer which includes at least a photoelectric conversion layer and is sandwiched by the pair of electrodes, the device including:

an electron blocking layer provided between the photoelectric conversion layer and one of the electrodes; and a hole blocking layer provided between the photoelectric conversion layer and the other of the electrodes, wherein the hole blocking layer includes a fullerene and/or a fullerene derivative and a transparent hole transport material having an ionization potential of 5.5 eV or more.

The "transparent hole transport material" herein will be described. The "transparent" as used herein refers to that the difference between the ionization potential and the electron affinity (gap between HOMO and LUMO) is 3.0 eV or more, and the "hole transport material" refers to a material having an ionization potential which is lower than that of a fullerene or a fullerene derivative having the lowest ionization potential of those included in the hole blocking layer.

The ionization potential of a material may be measured using a surface analyzer after forming a film of the material on a quartz substrate with a film thickness of 100 nm. Here, the AC-2 surface analyzer of Riken Keiki Co., Ltd. is used.

The difference between the ionization potential and the electron affinity may be determined by first measuring the specular of the film of the material formed and obtaining the energy of the absorption edge. The energy of the absorption edge corresponds the energy difference between the ionization potential and the electron affinity.

In the photoelectric conversion device of the present invention, the hole blocking layer is preferably a mixed layer of the fullerene and/or the fullerene derivative and the transparent hole transport material having an ionization potential of 5.5 eV or more. The mixed layer as used herein refers to a layer in which a plurality of materials is mixed or dispersed.

The hole blocking layer preferably includes the fullerene and/or the fullerene derivative with a content of 30 vol % to 80 vol % and more preferably with a content of 50 vol % to 75 vol %. The content as used herein refers to the total amount of the fullerene and/or the fullerene derivative included in the hole blocking layer.

The hole blocking layer preferably has an average film thickness of 5 nm to 100 nm and more preferably 10 nm to 20 nm.

The photoelectric conversion layer is preferably a bulk hetero layer in which a p-type organic material and an n-type organic material are mixed, and preferably includes a fullerene and/or a fullerene derivative.

Further, the photoelectric conversion device of the present invention is preferably of a structure in which the electrode on the hole blocking layer side is a transparent electrode disposed on the light receiving side, that is, the photoelectric conversion device of the present invention preferably includes a hole collection electrode/an electron blocking layer/a photoelectric conversion layer/a hole blocking layer/a transparent electron collection electrode layered in this order.

Further, it is preferable that the value obtained by dividing a voltage applied to the pair of electrodes from outside by a distance between the pair of electrodes is $1 \times 10^5$ V/cm to $1 \times 10^7$ V/cm.

An imaging device of the present invention is a device, including a plurality of the photoelectric conversion devices of the present invention described above, and a circuit substrate on which is formed a signal readout circuit that reads out a signal according to a charge generated in the photoelectric conversion layer of the photoelectric conversion device.

The photoelectric conversion device of the present invention includes a mixed layer of a fullerene and/or a fullerene derivative and a transparent hole transport material having an ionization potential of 5.5 eV or more as the hole blocking layer. According to such a structure, hole injection from the electrode may be suppressed satisfactorily without reducing the transport rate of the holes generated in the hole blocking layer within the layer. Therefore, according to the present invention, a photoelectric conversion device having a good sensitivity, a favorable S/N ratio of photo current/dark current, and a fast response speed may be provided.

BEST MODE FOR CARRYING OUT THE INVENTION (Photoelectric Conversion Device)

Figure 1:
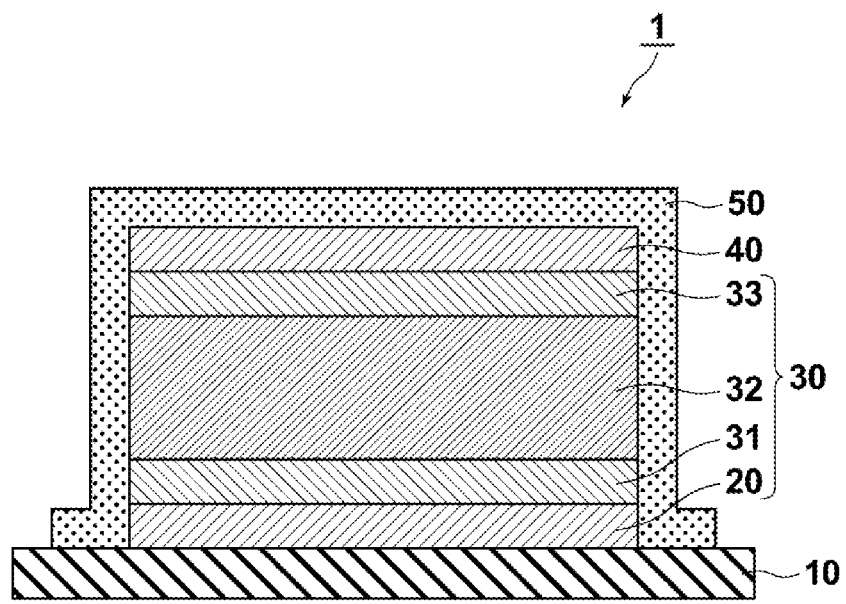
FIG. 1 is a schematic cross-sectional view of a photoelectric conversion device according to one embodiment of the present invention, schematically illustrating the structure thereof.

A photoelectric conversion device of one embodiment according to the present invention will be described with reference to the accompanying drawings. FIG. 1 is a schematic cross-sectional view of the photoelectric conversion device of the present embodiment, illustrating the structure thereof. In the drawings of the present specification, each component is not necessarily drawn to scale for ease of visual recognition.

As illustrated in FIG. 1, an organic photoelectric conversion device 1 (photoelectric conversion device 1) includes a substrate 10, a hole collection electrode 20 formed on the substrate 10, an electron blocking layer 31 formed on the hole collection electrode 20, a photoelectric conversion layer 32 formed on the electron blocking layer 31, a hole blocking layer 33 formed on the photoelectric conversion layer 32, an electron collection electrode 40 formed on the hole blocking layer 33, and a sealing layer 50 covering the surface of the electron collection electrode 40 and the sides of the layered body of the hole collection electrode 20 to the electron collection electrode 40.

In the photoelectric conversion device 1, a light receiving layer 30 is formed by the electron blocking layer 31, the photoelectric conversion layer 32, and the hole blocking layer 33.

In the photoelectric conversion device 1, the electron collection electrode 40 is the electrode on the light incident side, and when light is incident from above the electron collection electrode 40, the light is incident on the photoelectric conversion layer 32 by transmitting through the electron collection electrode 40, and charges are generated therein. Holes of the generated charges are moved to the hole collection electrode 20 while the electrons are moved to the electron collection electrode 40.

The holes of the charges generated in the photoelectric conversion layer 32 may be moved to the hole collection electrode 20 while the electrons may be moved to the electron collection electrode 40 by applying a bias voltage (external electric field) between the electron collection electrode 40 and the hole collection electrode 20. Preferably, the external electric field applied between the hole collection electrode 20 and the electron collection electrode 40 is $1 \times 10^5$ V/cm to $1 \times 10^7$ V/cm in order to obtain excellent properties in photoelectric conversion efficiency (sensitivity), dark current, and light response speed.

In the photoelectric conversion device 1, the hole blocking layer 33 is a layer that suppresses hole injection from the electron collection electrode 40 when the external voltage is applied and includes a fullerene and/or a fullerene derivative and a transparent hole transport material having an ionization potential value of 5.5 eV or more. Further, the hole blocking layer 33 has a function to inhibit film forming damage by protecting the photoelectric conversion layer 32 when the layer to be formed thereon (electron collection electrode 40 in the present embodiment) is formed.

There is not any specific restriction on the fullerene and/or the fullerene derivative, and may include fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed-fullerene, fullerene nanotubes, and the like. The skeleton of a typical fullerene is shown below.

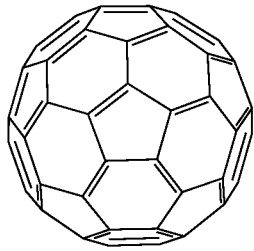 [SMILES: c1cc2c3ccc4c5ccc6c7ccc8c9ccc%10c1c1c2c2c3c4c3c5c6c4c7c8c5c9c%10c1c1c2c3c4c51]

The fullerene derivative refers to compounds obtained by adding substituent groups to those fullerenes. Preferable substituent groups of the fullerene derivatives may be alkyl group, aryl group, or heterocyclic group. An alkyl group having 1 to 12 carbon atoms is more preferable as the alkyl group. As the aryl group and the heterocyclic group, benzene ring, naphthalene ring, anthracene ring, phenanthrene ring, fluorene ring, triphenylene ring, naphthalene ring, biphenyl ring, pyrrole ring, furan ring, thiophene ring, imidazole ring, oxazole ring, thiazole ring, pyridine ring, pyrazine ring, pyrimidine ring, pyridazine ring, indolizine ring, indole ring, benzofuran ring, benzothiophene ring, isobenzofuran ring, benzimidazole ring, imidazopyridine ring, quinolizine ring, quinoline ring, phthalazine ring, naphthyridine ring, quinoxaline ring, quinoxazoline ring, isoquinoline ring, carbazole ring, phenanthridine ring, acridine ring, phenanthroline ring, thianthrene ring, chromene ring, xanthene ring, phenoxathiin ring, phenothiazine ring, or phenazine ring is preferable. Here, benzene ring, naphthalene ring, anthracene ring, phenanthrene ring, pyridine ring, imidazole ring, oxazole ring, or thiazole ring is more preferable, and benzene ring, naphthalene ring, or pyridine ring is particularly preferable. These may further have a substituent group and the substituent may be coupled as far as possible to form a ring. They may have a plurality of substituent groups which may be identical or different. Further, the plurality of substituent groups may be coupled as far as possible to form a ring.

There is not any specific restriction on the transparent hole transport material as long as it has an ionization potential of 5.5 eV or more. Even it is a hole transport material, if the material has an ionization potential of 5.5 eV or more, it may effectively suppress the hole injection from the electron collection electrode 40 to the photoelectric conversion layer 32.

Such transparent hole transport materials include Compounds 1 to 4 shown below and the like.

Compound 1

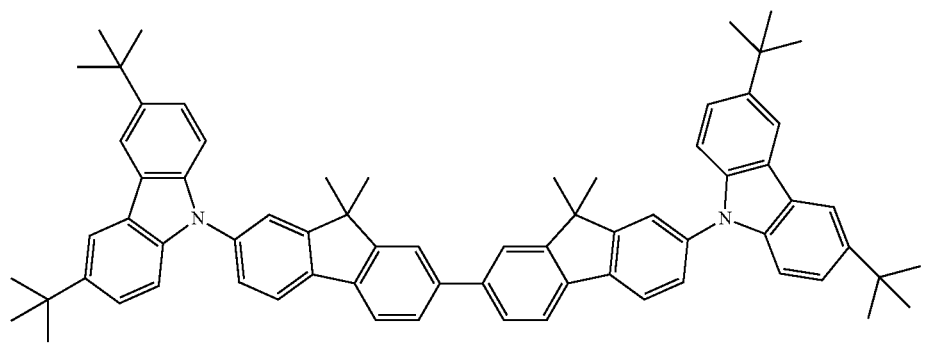

Compound 2

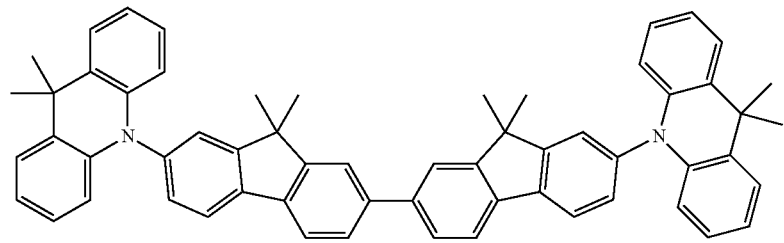

Compound 3

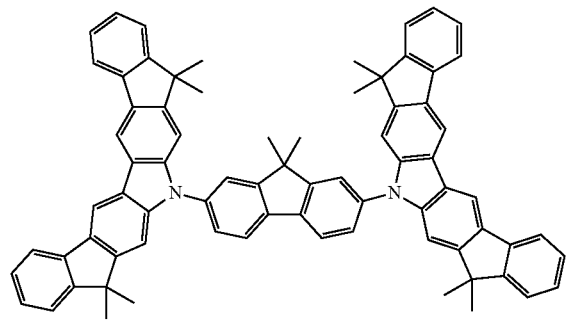

Compound 4

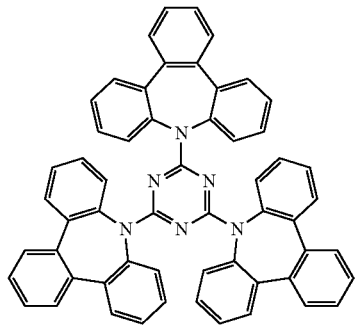

The hole blocking layer 33 may be a layer in which the ratio of the fullerene and/or the fullerene derivative and the transparent hole transport material is constant or a graded composition layer in which the ratio differs in a film thickness direction.

There is not any specific restriction on the aforementioned ratio in the hole blocking layer 33, but if the content of the fullerene and/or the fullerene derivative is too small, the electron transport capability in the hole blocking layer 33 is reduced and the efficiency to transport electrons (carriers) generated in the photoelectric conversion layer 32 to the electron collection electrode 40 is reduced, whereby the sensitivity is degraded.

As described above, the fullerene and the fullerene derivative absorb visible light, so that carries are generated even in the hole blocking layer 33 by the absorbed light. If the content of the fullerene and/or the fullerene derivative in the hole blocking layer 33 is too much, the hole transport capability in the hole blocking layer 33 is reduced, thereby causing reduction in the response speed.

From this viewpoint, the content of the fullerene and/or the fullerene derivative in the hole blocking layer 33 is preferably 30 vol % to 80 vol %, and more preferably 50 vol % to 75 vol %.

Further, the hole blocking layer 33 may be a mixed layer of a plurality of materials mixed or dispersed, or a plurality of layers layered on top of each other, each having a different ratio between the fullerene and/or the fullerene derivative and the transparent hole transport material, but the mixed layer is preferable.

There is not any specific restriction on the film forming method of the hole blocking layer 33, but it is preferable that all the process steps are performed in a vacuum during the film forming. Basically, it is preferable that the compound is prevented from directly contacting the oxygen and moisture in the ambient air. Such film forming method may be a vacuum deposition method. In the vacuum deposition method, it is preferable that the deposition speed is PI or PID controlled using a film thickness monitor, such as a crystal oscillator, an interferometer, and the like.

In the case of a mixed layer, a co-deposition method that allows simultaneous deposition of the transparent hole transport material and the fullerene may be used, and it is preferable that the co-deposition method is performed using resistance heating evaporation, electron beam evaporation, flash evaporation, and the like.

There is not any specific restriction on the film thickness of the hole blocking layer 33 as long as it allows the layer to sufficiently function as a hole blocking layer, but an excessive thickness is undesirable because the supply voltage required to apply an appropriate electric field intensity to the photoelectric conversion layer 32 is increased. Therefore, the film thickness of the hole blocking layer 33 is preferably 5 nm to 100 nm, more preferably 10 nm to 50 nm, and further preferably 10 nm to 20 nm.

As shown in Table 2 that summarizes examples and comparative examples to be described later and their results, the photoelectric conversion device 1 may, in the hole blocking layer 33, favorably suppress the hole injection from the electrode without reducing the transport rate of the holes generated in the hole blocking layer 33 within the hole blocking layer 33, whereby a favorable S/N ratio of photo current/dark current and a favorable response speed may be achieved.

Structures of the photoelectric conversion device 1 other than the hole blocking layer 33 will now be described in detail.

<Substrate and Electrodes>

There is not any specific restriction on the substrate 10, and a silicon substrate, a glass substrate, and the like may be used.

The hole collection electrode 20 is an electrode for collecting holes of the charges generated in the photoelectric conversion layer 32, and corresponds to the pixel electrode in the structure of an imaging device, to be described later. There is not any specific restriction on the material of the hole collection electrode 20 as long as it has good conductivity, but sometimes it is given a transparency and other times a material that reflects light is used without giving transparency, depending on the application.

Specific materials include metals, metal oxides, metal nitrides, metal borides, organic conductive compounds, mixtures thereof, and the like. More specific examples include conductive metal oxides, such as tin oxides doped with antimony or fluorine (ATO, FTO), tin oxides, zinc oxides, indium oxides, indium tin oxide (ITO), indium zinc oxides (IZO), and the like; metals, such as gold, silver, chrome, nickel, titanium, tungsten, aluminum, and the like; conductive compounds, such as oxides and nitrides of these metals (titanium nitride (TiN) by way of example); mixtures or layered body of these metals and conductive metal oxides; inorganic conductive substances, such as copper iodide, copper sulfide, and the like; organic conductive materials, such as polyaniline, polythiophene and polypyrrole; and layered bodies of these and ITO or titanium nitride. Particularly preferable as the hole collection electrode 20 is one of the materials of titanium nitride, molybdenum nitride, tantalum nitride, and tungsten nitride.

The electron collection electrode 40 is an electrode for collecting electrons of the charges generated in the photoelectric conversion layer 32, and is the transparent electrode disposed on the light receiving side in the present embodiment. There is not any specific restriction on the material of the electron collection electrode 40 as long as it is a conductive material which is sufficiently transparent to light having wavelengths to which the photoelectric conversion layer 32 has sensitivity, but the use of a transparent conductive oxide is preferable in order to increase the absolute amount of light incident on the photoelectric conversion layer 32 and external quantum efficiency. The electron collection electrode 40 corresponds to the opposite electrode in the structure of an imaging device, to be described later.

As for the electron collection electrode 40, one of the materials of ITO, IZO, $SnO_2$, ATO (antimony-doped tin oxide), ZnO, AZO (Al-doped zinc oxide), GZO (gallium-doped zinc oxide), $TiO_2$, FTO (fluorine-doped tin oxide) may be cited.

The light transmission rate of the electron collection electrode 40 is preferably 60% or more, more preferably 80% or more, more preferably 90% or more, and more preferably 95% or more in the visible light wavelengths.

There is not any specific restriction on the method of forming the electrodes (20, 40) and may be selected appropriately by considering the suitability for the electrode material. More specifically, the electrodes may be formed by wet methods, such as printing, coating, and the like, physical methods, such as vacuum deposition, sputtering, ion plating, and the like, chemical methods, such as CVD, plasma CVD, and the like, and others.

If the electrode material is ITO, the electrodes may be formed by electron beam method, sputtering method, resistance heating deposition method, chemical reaction method (such as sol-gel method), method of coating a dispersion of indium tin oxide. Further, a UV-ozone treatment, a plasma treatment, and the like may be performed on the film formed of ITO. If the electrode material is TiN, various methods, including the reactive sputtering method, may be used and annealing, a UV-ozone treatment, a plasma treatment, and the like may be performed thereon.

If a transparent conductive film, such as TCO, is used as the electron collection electrode 40, a DC short circuit or an increase in leak current may sometimes occur. One of the causes for this is considered that the fine cracks introduced into the photoelectric conversion layer 32 are covered by a dense film, such as TCO, and the conduction to the lower electrode 20 on the opposite side is increased. Therefore, in the case of an electrode having a relatively poor film quality, the increase in leak current is less likely to occur. By controlling the film thickness of the electron collection electrode 40 with respect to the film thickness of the photoelectric conversion layer 32 (that is, crack depth), the increase in leak current may be suppressed largely. Preferably, the thickness of the electron collection electrode 40 is ⅕ of the thickness of the photoelectric conversion layer 32 or less, and more preferably ⅒ or less.

Generally, if a conductive film is made thinner than a certain range, the resistance value increases rapidly, but in a solid imaging device that incorporates the photoelectric conversion device according to the present embodiment, the sheet resistance may preferably be 100 to 10000Ω/□, and has a large freedom of film thickness range in which the film thickness can be reduced. Further, the thinner the thickness of the upper electrode 40, the less amount of light is absorbed thereby, and light transmission rate is generally increased. The increase in the light transmission rate is very desirable as it increases light absorption in the photoelectric conversion layer 32 and photoelectric conversion capability. The film thickness of the electron collection electrode 40 is preferably 5 to 100 nm and more preferably 5 to 20 nm in view of the suppression of leak current, the resistance value increase in a thin film, and the transmission rate increase.

<Light Receiving Layer>

The light receiving layer 30 is a layer that includes at least the electron blocking layer 31, the photoelectric conversion layer 32, and the already described hole blocking layer.

There is not any specific restriction on the film forming method of the light receiving layer 30, and it may be formed by each of dry film forming methods or wet film forming methods. But, as described in the explanation of the hole blocking layer, it is preferable that all the process steps are performed in a vacuum during the film forming, and basically it is preferable that the compound is prevented from directly contacting the oxygen and moisture in the ambient air. Such film forming method may be a vacuum deposition method. In the vacuum deposition method, it is preferable that the deposition speed is PI or PID controlled using a film thickness monitor, such as a crystal oscillator, an interferometer, and the like. Further, if two or more kinds of compounds are deposited simultaneously, a co-deposition method may be used, and it is preferable that the co-deposition method is performed using resistance heating evaporation, electron beam evaporation, flash evaporation, and the like.

If the light receiving layer 30 is formed by a dry film forming method, the degree of vacuum during the formation is preferably $1 \times 10^{-3}$ Pa or less, more preferably $4 \times 10^{-4}$ Pa or less, and particularly preferably $1 \times 10^{-4}$ Pa or less, in view of preventing degradation in device characteristics during the formation of the light receiving layer.

The thickness of the light receiving layer 30 is preferably 10 nm to 1000 nm, further preferably 50 nm to 800 nm, and particularly preferably 100 nm to 600 nm. The thickness of 10 nm or more may provide a favorable dark current suppression effect while the thickness of 1000 nm or less may provide a favorable photoelectric conversion efficiency (sensitivity).

<<Photoelectric Conversion Layer>>

In the photoelectric conversion device 1, the photoelectric conversion layer 32 is a layer that receives light and generates charges according to the amount of light received and is formed by including an organic photoelectric conversion material.

There is not specific restriction on the photoelectric conversion layer 32, but preferably it is a layer which include a p-type organic semiconductor or an n-type organic semiconductor and more preferably it is a layer that includes a bulk hetero layer (mixed layer) of an organic p-type compound and an organic n-type compound mixed together in at least a part thereof. The use of the bulk hetero layer as the photoelectric conversion layer allows the photoelectric conversion efficiency (sensitivity) to be improved. By producing a bulk hetero layer with an optimum mixing ratio, the electron mobility and the hole mobility of the photoelectric conversion layer may be increased, whereby the light response speed of the photoelectric conversion layer may be increased.

Further, the photoelectric conversion layer 32 preferably includes a fullerene and/or a fullerene derivative as the n-type organic semiconductor. The inclusion of the fullerene and/or the fullerene derivative causes molecules of the fullerene or the fullerene derivative to be in a continuous state to form an electron path, whereby the electron transportability is improved and high speed responsiveness of the organic photoelectric conversion may be realized by compensating for a drawback of short carrier diffusion length of the photoelectric conversion layer.

In the photoelectric conversion layer 32, an excessive amount of the fullerene or the fullerene derivative results in that the p-type organic semiconductor is decreased whereby the junction interface is reduced and the exciton dissociation efficiency is reduced, thereby resulting in a reduced absorption amount of incident light. The total amount of the fullerene and/or the fullerene derivative in the photoelectric conversion layer 32 is preferably 40 vol % to 85 vol %.

The fullerene and/or the fullerene derivative in the photoelectric conversion 32 are as in the hole blocking layer 33 and the description thereof is omitted here.

In the photoelectric conversion layer 32, the p-type organic semiconductor mixed with the fullerene and/or the fullerene derivative is a donor organic semiconductor (compound) mainly represented by a hole transport organic compound and is an organic compound having properties to easily donate electrons, and more specifically, when two organic materials are used in contact with each other, an organic compound having an ionization potential smaller than that of the other. Therefore, any organic compound may be used as the donor organic compound as long as it has electron donating properties.

As for the p-type organic semiconductor, for example, triarylamine compounds, pyran compounds, quinacridone compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbocyclic compounds (naphthalene derivatives, anthracene derivatives, phenanthrene derivatives, tetracene derivatives, pyrene derivatives, perylene derivatives, fluoranthene derivative) and metal complexes having a nitrogen-containing heterocyclic compound as a ligand may be used, in which triarylamine compounds, pyran compounds, quinacridone compounds, pyrrole compounds, phthalocyanine compounds, merocyanine compounds, and condensed aromatic carbocyclic compounds are preferable.

Examples of p-type organic semiconductors that can achieve a high S/N ratio include the triarylamine compound described in Japanese Patent No. 4213832, Compound 5 shown below, and the like.

Compound 5

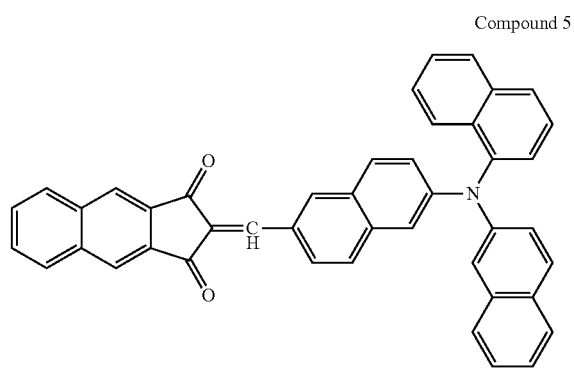 [SMILES: O=C1C(=Cc2ccc3cc(N(c4ccc5ccccc5c4)c4cccc5ccccc45)ccc3c2)C(=O)c2cc3ccccc3cc21]

The photoelectric conversion layer 32 is a non-emissive layer unlike an organic EL emission layer (layer that converts an electrical signal to light). The "non-emissive layer" refers to a layer having a luminescent quantum efficiency of 1% or less, preferably 0.5% or less, and more preferably 0.1% or less in the visible light region (wavelengths of 400 nm to 730 nm). In the photoelectric conversion layer 32, a luminescent quantum efficiency exceeding 1% is undesirable, because when the photoelectric conversion layer is applied to a sensor or an imaging device, it affects sensing performance or imaging performance.

<<Electron Blocking Layer>>

The electron blocking layer 31 is a layer for suppressing injection of electrons from the hole collection electrode 20 to the photoelectric conversion layer 32. The layer may be famed of an organic material single film or a mixed film of a plurality of different organic materials or inorganic materials.

The electron blocking layer 31 may be formed of a plurality of layers. This causes an interface to be created between each layer constituting the electron blocking layer 31 and discontinuity occurs in the intermediate level present in each layer. As a result, charge transfer via the intermediate level and the like becomes difficult to occur so that the electron blocking effect is increased. If each layer constituting the electron blocking layer 31 is made of the same material, however, the intermediate level presents in each layer may possible be exactly the same, it is preferable that a different material is used for each layer in order to enhance the electron blocking efficiency.

The electron blocking layer 31 is preferably made of a material having a high barrier against electron injection from the hole collection electrode 20 and high hole transporting properties. As for the electron injection barrier, the electron affinity of the electron blocking layer is smaller than the work function of the adjacent electrode by 1 eV or more, more preferably by 1.3 eV or more, and particularly preferably by 1.5 eV or more.

The electron blocking layer 31 is preferably 20 nm or more, more preferably 40 nm or more, and further preferably 60 nm or more in order to sufficiently inhibit the contact between the hole collection electrode 20 and the photoelectric conversion layer 32 and to avoid influence of defects or foreign particles present on the surface of the hole collection electrode 20.

If a charge blocking layer formed of the already described hole blocking layer 33 and the electron blocking layer 31 is made too thick, problems that the supply voltage required to apply an appropriate electric field intensity to the photoelectric conversion layer is increased and a carrier transport process in the charge blocking layer gives adverse effects to the performance of the photoelectric conversion device may possibly occur. Therefore, the total film thickness of the hole blocking layer 33 and the electron blocking layer 31 is preferably designed to 300 nm or less. The total film thickness is more preferably 200 nm or less, and further preferably 100 nm or less.

An electron donating organic material may be used for the electron blocking layer 31. More specifically, low molecular weight materials include aromatic diamine compounds, such as N,N'-bis(3-methylphenyl)-(1,1'-biphenyl)-4,4'-diamine (TPD), 4,4'-bis[N-(naphthyl)-N-phenyl-amino]biphenyl (α-NPD), and the like, porphyrin compounds, such as, oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphine, tetraphenylporphine copper, phthalocyanine, copper phthalocyanine, titanium phthalocyanine oxide, and the like, triazole derivatives, oxadiazole derivatives, imidazole derivatives, polyarylalkane derivatives, pyrazoline derivatives, pyrazolone derivatives, phenylenediamine derivatives, arylamine derivatives, fluorene derivatives, amino-substituted chalcone derivatives, oxazole derivatives, styryl anthracene derivatives, fluorenone derivatives, hydrazone derivatives, silazane derivatives, and the like, while polymeric materials include polymers, such as phenylene vinylene, fluorene, carbazole, indole, pyrene, pyrrole, picoline, thiophene, acetylene, diacetylene, and the like, and their derivatives. Even a non-electron donating compound may be used as long as it has a sufficient hole transporting property. More specifically, for example, the compounds described in Japanese Unexamined Patent Publication No. 2008-072090 and the like may preferably be used.

As for the electron blocking layer 31, inorganic materials may also be used. Generally, inorganic materials have a higher dielectric constant than that of organic materials, and the use of an inorganic material for the electron blocking layer 31 causes more voltage to be applied to the photoelectric conversion layer 32 and the photoelectric conversion efficiency (sensitivity) may be increased. Materials that can be the electron blocking layer 31 include calcium oxide, chromium oxide, chromium oxide copper, manganese oxide, cobalt oxide, nickel oxide, copper oxide, gallium oxide copper, strontium oxide copper, niobium oxide, molybdenum oxide, indium oxide copper, indium oxide silver, iridium oxide, and the like.

If the electron blocking layer 31 is a single layer, the single layer may be made of an inorganic material and if it is formed of a plurality of layers, one or two or more layers may be famed of inorganic materials.

<Sealing Layer>

The sealing layer 50 is a layer for preventing deterioration of the photoelectric conversion layer over a long period of storage/use by blocking the intrusion of factors that deteriorate the photoelectric conversion material, such as water molecules and oxygen molecules, after the photoelectric conversion device 1 or an imaging device 100, to be described later, is produced. The sealing layer 50 is also a layer for protecting the photoelectric conversion layer in the process of manufacturing the imaging device 100 after the sealing layer is formed by blocking the intrusion of factors, included in solution, plasma, and the like, that deteriorate the photoelectric conversion layer.

The sealing layer 50 is formed to cover the hole collection electrode 20, the electron blocking layer 31, the photoelectric conversion layer 32, the hole blocking layer 33, and the electron collection electrode 40.

As the incident light reaches the photoelectric conversion layer 32 through the sealing layer 50 in the photoelectric conversion device 1, the sealing layer needs to be sufficiently transparent to light having wavelengths to which the photoelectric conversion layer 32 has sensitivity. As for such sealing layer 50, ceramics, such as dense metal oxide, metal nitride, metal nitride which are impervious to water molecules, and diamond-like carbon (DLC) may be cited as examples, and conventionally, aluminum oxide, silicon oxide, silicon nitride, silicon nitride oxide, a layered film of these, and a layered film of these and an organic polymer, and the like have been used.

The sealing layer 50 may be formed of a thin film made of a single material, but by forming the sealing layer in a multilayer structure and giving a separate function to each layer, advantageous effects, such as stress relaxation of the entire sealing layer 50, inhibition of generation of defects, including cracks and pinholes, due to dust during the manufacturing process, ease of optimization of material development, and the like can be expected. For example, the sealing layer 50 may be formed in a two-layer structure in which a "sealing auxiliary layer" is stacked on a layer that performs the original purpose of preventing the intrusion of deterioration factors, such as water molecules, the sealing auxiliary layer being given a function which is difficult to be achieved by the layer that performs the original purpose. A three or more layer structure may be possible, but the number of layers is preferably as small as possible in view of cost.

There is not any specific restriction of the method of forming the sealing layer 50, and the sealing layer is preferably formed by a method that does not deteriorate, as much as possible, the performance and film quality of the layers already formed, such as the photoelectric conversion layer 32 and the like.

The performance of an organic photoelectric conversion material is significantly deteriorated by the presence of deterioration factors, such as water molecules and oxygen molecules. Therefore, it is necessary to cover and seal the entire photoelectric conversion layer by a dense metal oxide, a metal nitride oxide, or the like that does not allow the deterioration factors to intrude into the layer. Conventionally, aluminum oxide, silicon oxide, silicon nitride, silicon nitride oxide, a layered structure of these, and a layered structure of these and an organic polymer, and the like have been formed as sealing layers by various types of vacuum film forming techniques.

In the conventional sealing layers, however, a thin film growth is difficult on steps (due to shadows by the steps) formed by structures of the substrate surface, small defects of the substrate surface, particles adhered to the substrate surface, and the like, and the film thickness is significantly thin on the steps in comparison with a flat portion. Consequently, the step portions serve as the routes of the deterioration factors. In order to completely cover the steps with the sealing layer, it is necessary to make the entire sealing layer thick by performing the film forming with a thickness of 1 µm on the flat portion. The degree of vacuum during the formation of the sealing layer is preferably $1 \times 10^3$ Pa or less and more preferably $5 \times 10^2$ Pa or less.

For an imaging device with a pixel size of less than 2 µm, in particular, about 1 µm, if the film thickness of the sealing layer 50 is large, the distance between the color filter and the photoelectric conversion layer is increased and incident light may diffract/diffuse within the sealing layer and color mixing may possibly occur. Therefore, in view of the application to an imaging device with a pixel size of about 1 µm, a sealing material/manufacturing method is required that does not deteriorate the device performance even when the film thickness of the sealing layer 50 is reduced.

An atomic layer deposition (ALD) method is one of the CVD methods and a technique of forming a thin film by alternately repeating adsorption/reaction of organometallic compound molecules, metal halide molecules, metal hydride molecules to the substrate surface and dissolution of unreacted groups contained therein. When reaching the substrate surface, the thin film material is in a low molecular state as described above, so that a thin film growth is possible only if there is a very small space into which the small molecules may intrude. Therefore, the atomic layer deposition method may completely cover a step portion (the thickness of the thin film grown on the step portion is the same as that grown on a flat portion) which has been difficult by conventional thin film forming methods, that is, it is very excellent in step coverage. Thus, the method can completely cover the steps formed by structures of the substrate surface, small defects of the substrate surface, particles adhered to the substrate surface, and the like, so that such steps do not serve as intrusion routes of the deterioration factors of the photoelectric conversion material. In a case where the sealing layer 50 is formed by the atomic layer deposition method, the required film thickness may be reduced more effectively than the conventional technology.

In a case where the sealing layer 50 is formed by the atomic layer deposition method, a material corresponding to the preferable ceramics for the sealing layer 50 described above may be selected as appropriate. But, as the photoelectric conversion layer of the present invention uses an organic photoelectric conversion material, the materials are limited to those that allow a thin film growth at a relatively low temperature that does not deteriorate the organic photoelectric conversion material. According to the atomic layer deposition method with the use of alkyl aluminum or aluminum halide as the material, a dense aluminum oxide thin film may be famed at a temperature lower than 200° C. that does not deteriorate the organic photoelectric conversion material. The use of trimethyl aluminum, in particular, is preferable, because it allows an aluminum oxide thin film to be formed at about 100° C. A suitable selection of a material from silicon oxides and titanium oxides is also preferable, because it allows a dense thin film to be formed at a temperature lower than 200° C. as in the aluminum oxides.

Preferably, the sealing layer has a thickness of 10 nm or more in order to sufficiently prevent intrusion of the factors, such as water molecules and the like, that deteriorate the photoelectric conversion material. In an imaging device, if the film thickness of the sealing layer is large, the incident light may diffract or diffuse within the sealing layer and color mixing may occur. Preferably, the thickness of the sealing layer is 200 nm or less.

The thin film formed by the atomic layer deposition method has incomparably good quality formed at a low temperature from the view point of step coverage and denseness. But, the physical properties of the thin film material may be deteriorated by a chemical used in a photolithography process. For example, as the aluminum oxide thin film formed by the atomic layer deposition method is amorphous, the surface may be eroded by alkali solutions, such as a developing solution and a peeling solution.

Further, thin films formed by CVD methods, such as the atomic layer deposition method, very often have a very large internal tensile stress and the thin film itself may have deterioration of cracking by a process in which heating and cooling are repeated intermittently, as in the semiconductor manufacturing process, and the storage/use over a long period of time under a high temperature/high humidity environment.

Therefore, if the sealing layer 50 formed by the atomic layer deposition method is used, a sealing auxiliary layer which is excellent in chemical resistance and capable of cancelling the internal stress of the sealing layer 50 is preferably formed.

An example of such sealing auxiliary layer may be a layer that includes any one of the ceramics, such as metal oxide, metal nitride, and metal nitride oxide excellent in chemical resistance formed by a physical vapor deposition (PVD) film forming method such as, for example, sputtering. Films of ceramics formed by the PVD methods, such as the sputtering method, often have a large compression stress and may cancel the tensile stress of the sealing layer 50 formed by the atomic layer deposition method.

[Imaging Device]

Figure 2:
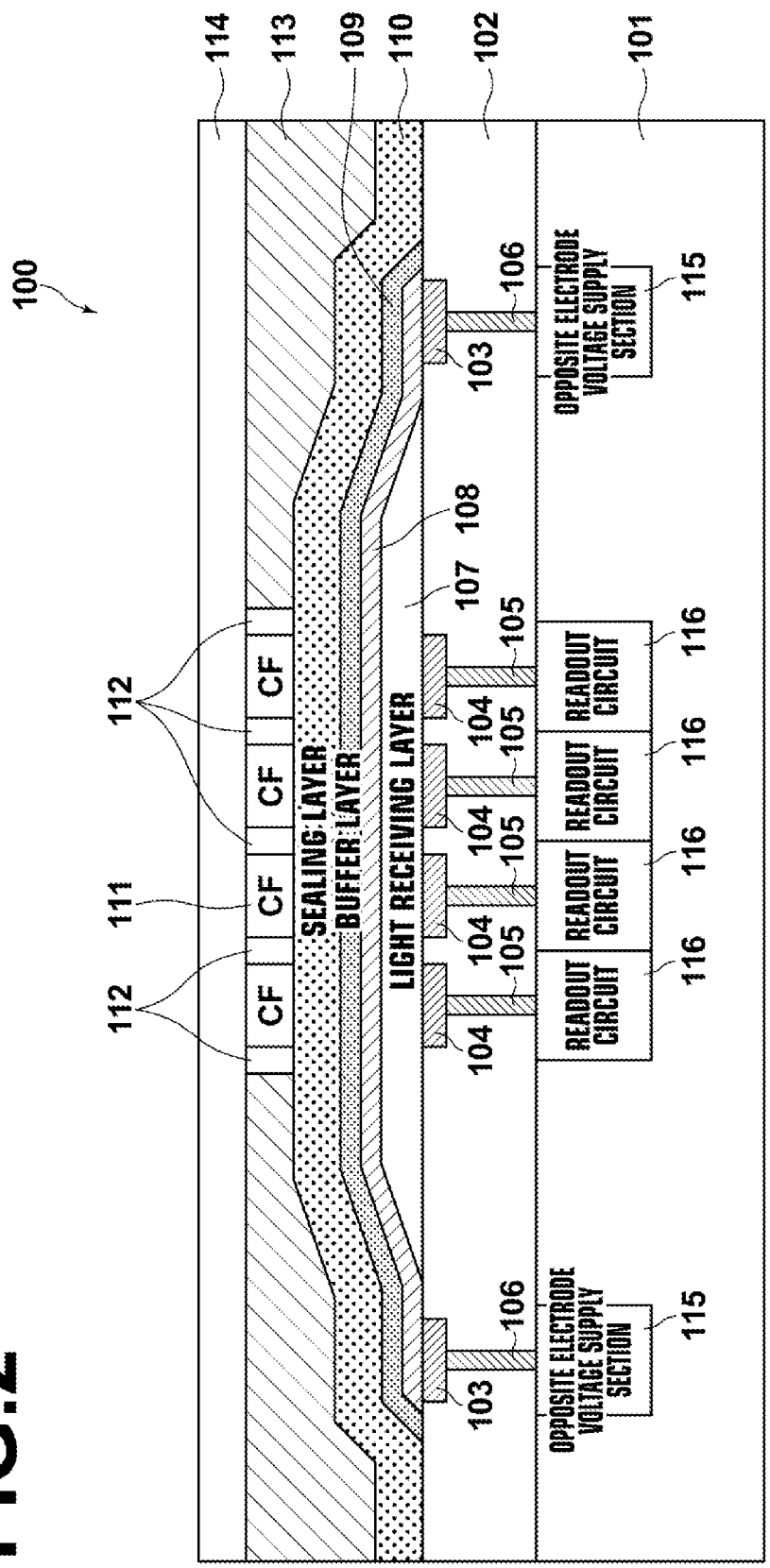
FIG. 2 is a schematic cross-sectional view of an imaging device according to one embodiment of the present invention, schematically illustrating the structure thereof.

Next, a structure of an imaging device 100 equipped with the photoelectric conversion device 1 will be described with reference to FIG. 2. FIG. 2 is a schematic cross-sectional view of an imaging device for explaining one embodiment of the present invention. The imaging device is used by being mounted on imaging apparatuses, such as digital cameras, digital video cameras, and the like, electronic endoscopes, imaging modules of cell phones and the like, and others.

The imaging device 100 includes a plurality of organic photoelectric conversion devices 1 having a structure shown in FIG. 1 and a circuit substrate on which is formed a readout circuit that reads out a signal according to a charge generated in the photoelectric conversion layer of each organic photoelectric conversion device, and has a structure in which the plurality of organic photoelectric conversion devices 1 is disposed one- or two-dimensionally on the same plane above the circuit substrate.

The imaging device 100 includes a substrate 101, an insulating layer 102, a connection electrode 103, a pixel electrode 104, a connection section 105, a connection section 106, a light receiving layer 107, an opposite electrode 108, a buffer layer 109, a sealing layer 110, a color filter (CF) 111, a partition wall 112, a light shielding layer 113, a protection layer 114, an opposite electrode voltage supply section 115, and a readout circuit 116.

The pixel electrode 104 has the same function as that of the hole collection electrode 20 of the organic photoelectric conversion device 1 illustrated in FIG. 1. The opposite electrode 108 has the same function as that of the electron collection electrode 40 of the organic photoelectric conversion device 1 illustrated in FIG. 1. The light receiving layer 107 has the same structure as that of the light receiving layer 30 provided between the hole collection electrode 20 and the electron collection electrode 40 of the organic photoelectric conversion device 1 illustrated in FIG. 1. The sealing layer 110 has the same function as that of the sealing layer 50 of the organic photoelectric conversion device 1 illustrated in FIG. 1. A pixel electrode 104, a portion of the opposite electrode 108 facing the pixel electrode 104, the light receiving layer 107 sandwiched by these electrodes, and portions of the buffer layer 109 and the sealing layer 110 constitute an organic photoelectric conversion device.

The substrate 101 is a glass substrate or a semiconductor substrate, such as Si or the like. The insulating layer 102 is formed on the substrate 101. A plurality of pixel electrodes 104 and a plurality of connection electrodes 103 are formed on the surface of the insulating layer 102.

The light receiving layer 107 is a layer which is provided over the plurality of pixel electrodes 104 to cover them and common to all of the organic photoelectric conversion devices.

The opposite electrode 108 is one electrode which is provided on the light receiving layer 107 and common to all of the organic photoelectric conversion devices. The opposite electrode 108 is formed over to the connection electrodes 103 disposed outside of the light receiving layer 107 and electrically connected to the connection electrodes 103.

The connection section 106 is buried in the insulating layer 102 and is a plug or the like for electrically connecting the connection electrode 103 and the opposite electrode voltage supply section 115. The opposite electrode voltage supply section 115 is formed in the substrate 101 and applies a predetermined voltage to the opposite electrode 108 via the connection section 106 and the connection electrode 103. In a case where the voltage to be applied to the opposite electrode 108 is higher than the power source voltage of the imaging device, the predetermined voltage described above is supplied by boosting the power source voltage with a booster circuit, such as a charge pump or the like.

The readout circuit 116 is provided in the substrate 101 correspondingly to each of a plurality of pixel electrodes 104, and is a circuit for reading out a signal according to a change collected by the corresponding pixel electrode 104. The readout circuit 116 is formed of, for example, a CCD circuit, a MOS circuit, a TFT circuit or the like, and shielded by a light shielding layer, not shown, disposed in the insulating layer 102. The readout circuit 116 is electrically connected to the corresponding pixel electrode 104 via the connection section 105.

The buffer layer 109 is formed on the opposite electrode 108 to cover the opposite electrode 108. The sealing layer 110 is formed on the buffer layer 109 to cover the buffer layer 109. The color filter 111 is formed at a position on the sealing layer 110 corresponding to each pixel electrode 104. The partition wall 112 is provided between the color filters 111 to improve light transmission rate of the color filters 111.

The light shielding layer 113 is formed on an area of the sealing layer 110 other than the areas where color filters 111 and partition walls 112 are formed to prevent light from entering a portion of the light receiving layer 107 other than the effective pixel areas. The protection layer 114 is formed on the color filters 111, the partition walls 112, and light shielding layer 113 to protect the entire imaging device 100.

In the imaging device 100 structured in the manner described above, when light is incident, the light enters in the light receiving layer 107 and charges are generated therein. Holes of the generated charges are collected by the pixel electrode 104 and a voltage signal according to the collected amount is outputted outside the imaging device 100 by the readout circuit 116.

The manufacturing method of the imaging device 100 is as follows. connection sections 105, 106, a plurality of connection electrodes 103, a plurality of pixel electrodes 104, and the insulating layer 102 are formed on a circuit substrate in which opposite electrode voltage supply sections 115 and readout circuits 116 are formed. The plurality of pixel electrodes 104 is disposed, for example, in a square grid pattern on the surface of the insulating layer 102.

Then, the light receiving layer 107, the opposite electrode 108, the buffer layer 109, and the sealing layer 110 are formed in order on the plurality of pixel electrodes 104. The methods of forming the light receiving layer 107, the opposite electrode 108, and sealing layer 110 are as describe in the foregoing explanation of the photoelectric conversion device 1. The buffer layer 109 is formed, for example, by a vacuum resistance heating evaporation method. Next, after forming the color filters 111, the partition walls 112, and the light shielding layer 113, the protection layer 114 is formed to complete the imaging device 100.

EXAMPLES AND COMPARATIVE EXAMPLES

Example 1

A glass substrate was prepared as the substrate, then a TiN hole collection electrode (100 nm thickness) was formed on the substrate by sputtering, and aforementioned Compound 1 was vacuum deposited to form an electron blocking layer (100 nm thickness).

Next, as the photoelectric conversion layer, a mixed layer of Compound 5 and $C_{60}$ was formed by co-deposition (400 nm thickness). Further, as the hole blocking layer, a mixed layer of Compound 1 and $C_{60}$ was formed on the photoelectric conversion layer by co-deposition (10 nm thickness). The deposition of the electron blocking layer, the photoelectric conversion layer, and the hole blocking layer were formed using a vacuum deposition system at a deposition speed of 3 Å/s under a degree of vacuum of $5.0 \times 10^{-4}$ Pa or less. The film forming of the photoelectric conversion layer was performed under the condition in which the mixing ratio of Compound 5 and $C_{60}$ was, Compound 5:$C_{60}$=1:3 (volume ratio), while the film forming of the hole blocking layer was performed under the condition in which the mixing ratio of Compound 1 and $C_{60}$ was, Compound 1:$C_{60}$=1:2 (volume ratio).

Thereafter, the electron collection electrode was formed by DC sputtering ITO (indium tin oxide) with a film thickness of 10 nm, and as the sealing layer that covers the hole collection electrode, the electron blocking layer, the photoelectric conversion layer, the hole blocking layer, and the electron collection electrode, an aluminum oxide layer was formed with a thickness of 100 nm by atomic layer deposition method, whereby a photoelectric conversion device of the present invention was obtained.

Example 2

A photoelectric conversion device was produced in the same manner as in Example 1 other than the condition of the composition of the hole blocking layer, in which the mixing ratio of Compound 1 and $C_{60}$ was changed to, Compound 1:$C_{60}$=1:3 (volume ratio).

Example 3

A photoelectric conversion device was produced in the same manner as in Example 1 other than the condition of the composition of the hole blocking layer, in which the mixing ratio of Compound 1 and $C_{60}$ was changed to, Compound 1:$C_{60}$=1:1 (volume ratio).

Example 4

A photoelectric conversion device was produced in the same manner as in Example 1 other than that the thickness of the hole blocking layer was changed to 20 nm.

Example 5

A photoelectric conversion device was produced in the same manner as in Example 1 other than that Compound 1 of the hole blocking layer was changed to Compound 2.

Example 6

A photoelectric conversion device was produced in the same manner as in Example 1 other than that Compound 1 of the hole blocking layer was changed to Compound 3.

Example 7

A photoelectric conversion device was produced in the same manner as in Example 1 other than that Compound 1 of the hole blocking layer was changed to Compound 4.

Comparative Example 1

A photoelectric conversion device was produced in the same manner as in Example 1 other than that the hole blocking layer was not formed.

Comparative Example 2

A photoelectric conversion device was produced in the same manner as in Example 1 other than that the composition of the hole blocking layer was changed to $C_{60}$ (100 mass %).

Comparative Example 3

A photoelectric conversion device was produced in the same manner as in Example 1 other than that Compound 1 of the hole blocking layer was changed to Compound 6.

Comparative Example 4

A photoelectric conversion device was produced in the same manner as in Example 1 other than that Compound 1 of the hole blocking layer was changed to Compound 7.

Comparative Example 5

A photoelectric conversion device was produced in the same manner as in Example 1 other than that Compound 1 of the hole blocking layer was changed to Compound 8.

Comparative Example 6

A photoelectric conversion device was produced in the same manner as in Example 1 other than that Compound 1 of the hole blocking layer was changed to Compound 9.

Comparative Example 7

A photoelectric conversion device was produced in the same manner as in Example 1 other than that Compound 1 of the hole blocking layer was changed to Compound 10.

Comparative Example 8

A photoelectric conversion device was produced in the same manner as in Example 1 other than that Compound 1 of the hole blocking layer was changed to Compound 11.

Comparative Example 9

A photoelectric conversion device was produced in the same manner as in Example 1 other than that Compound 1 of the hole blocking layer was changed to Compound 12.

Comparative Example 10

A photoelectric conversion device was produced in the same manner as in Example 1 other than that Compound 1 of the hole blocking layer was changed to Compound 13.

(Evaluation)

With respect to the aforementioned examples and comparative examples, sensitivity, dark current, and light response speed were evaluated. The evaluation of sensitivity, dark current, and light response speed was performed while applying a positive bias of $3.0 \times 10^5$ V/cm to the electron collection electrode of the photoelectric conversion device. The dark current was measured by a 6430-type source meter manufactured by Keithley, Co., Ltd., under a light shielded condition. The sensitivity was obtained by measuring a current value by the 6430-type source meter manufactured by Keithley, Co., Ltd. when light having a wavelength of 560 nm and an energy of 50 $\mu$W/cm$^2$ was directed onto the device, and subtracting the dark current from the current value. The light response speed was evaluated by directing LED light having a center wavelength of 525 nm onto the device and calculating the ratio of residual current (current value/current value when the light was directed) at the time 100 $\mu$s after the directed light was turned off.

Table 1 summarizes ionization potential values and differences between ionization potential values and electron affinity values of Compounds 1 to 4, Compounds 6 to 13, and $C_{60}$ used in each example, while Table 2 summarizes evaluation results of the devices produced.

Figure 3:
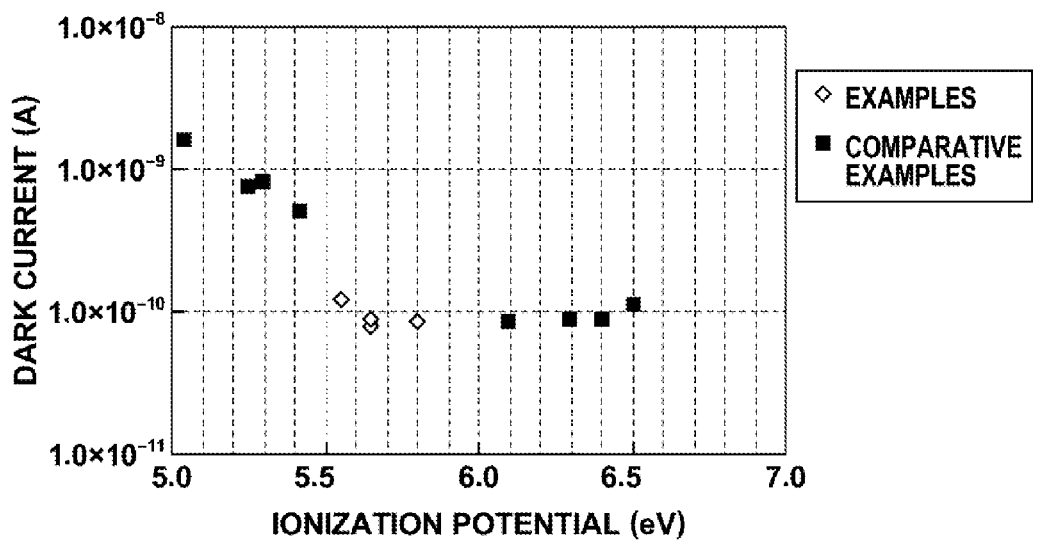
FIG. 3 illustrates the relationship between dark current values and ionization potential values of transparent hole transport materials of the hole blocking layers of the photoelectric conversion devices of examples and comparative examples.
Figure 4:
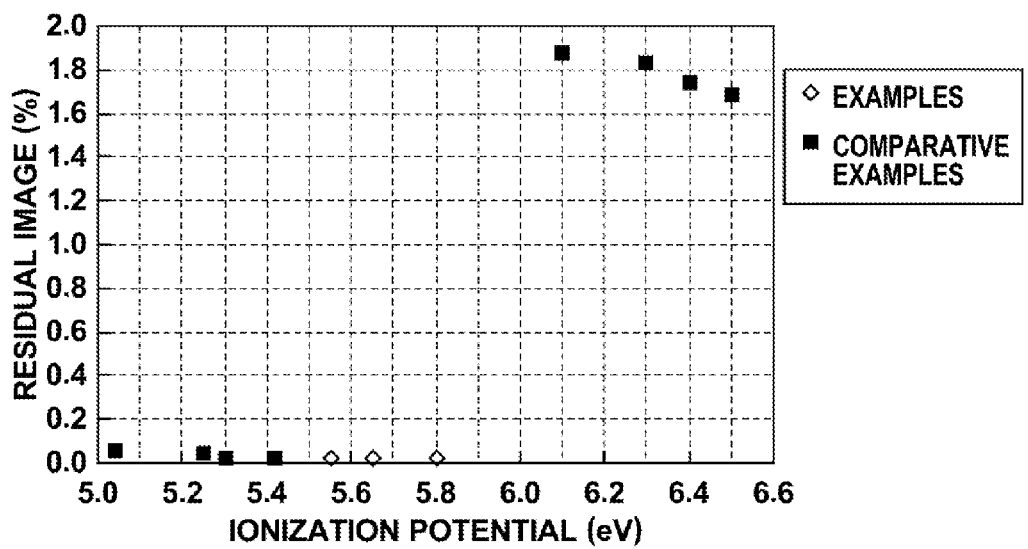
FIG. 4 illustrates the relationship between the response speeds and ionization potential values of transparent hole transport materials of the hole blocking layers of the photoelectric conversion devices of examples and comparative examples.

Further, the relationship between the ionization potential value and the dark current and the relationship between the ionization potential value and the residual image of the compound used in each example are shown in FIGS. 3 and 4 respectively.

As shown in Table 2, and FIGS. 3 and 4, it was confirmed that, in comparison with Comparative Example 1 having no hole blocking layer, Examples 1 to 7 have low dark current values and favorable responsiveness with less residual image by the introduction of the hole blocking layer of the present invention.

Further, in Comparative Examples 2, 3, 8, 9, and 10 that do not satisfy the condition of the hole blocking layer, degradation in responsiveness was confirmed in comparison with the examples. In Comparative Example 2 and Comparative Example 3, the degradation in responsiveness is thought to be caused that the transport rate of holes generated in the hole blocking layer is slow in comparison with those of the examples and the holes served as the cause of residual image.

Further, as the ionization potentials of the compounds used (Compounds 7 to 10) are 5.5 eV or less in Comparative Examples 4, 5, 6, and 7, the hole injection occurred from the electron collection electrode to the photoelectric conversion layer and dark currents are increased largely in comparison with those of the examples. From the foregoing, the effectiveness of the present invention has been confirmed.

TABLE 1

|  | Ionization Potential (eV) | Δ Ionization Potential-Electron Affinity |
|---|---|---|
| Compound 1 | 5.65 | 3.05 |
| Compound 2 | 5.65 | 3.05 |
| Compound 3 | 5.55 | 3.13 |
| Compound 4 | 5.8 | 3.9 |
| Compound 6 | 6.3 | 3.5 |
| Compound 7 | 5.42 | 3.0 |
| Compound 8 | 5.04 | 3.0 |
| Compound 9 | 5.3 | 3.27 |
| Compound 10 | 5.25 | 3.26 |
| Compound 11 | 6.5 | 3.5 |
| Compound 12 | 6.4 | 3.5 |
| Compound 13 | 6.1 | 3.5 |
| $C_{60}$ | 6.0 | |

TABLE 2

|  | Composition of Hole Blocking Layer | Thickness of Hole blocking Layer (nm) | Relative Sensitivity | Dark Current (A/cm$^2$) | Light Response Speed (%) |
|---|---|---|---|---|---|
| Example 1 | $C_{60}$:Compound 1 = 2:1 | 10 | 1 | $0.8 \times 10^{-10}$ | 0.02 |
| Example 2 | $C_{60}$:Compound 1 = 3:1 | 10 | 1 | $0.8 \times 10^{-10}$ | 0.02 |
| Example 3 | $C_{60}$:Compound 1 = 1:1 | 10 | 1 | $0.8 \times 10^{-10}$ | 0.02 |
| Example 4 | $C_{60}$:Compound 1 = 2:1 | 20 | 1 | $0.8 \times 10^{-10}$ | 0.02 |
| Example 5 | $C_{60}$:Compound 2 = 2:1 | 10 | 1 | $0.9 \times 10^{-10}$ | 0.02 |
| Example 6 | $C_{60}$:Compound 3 = 2:1 | 10 | 1 | $1.2 \times 10^{-10}$ | 0.02 |
| Example 7 | $C_{60}$:Compound 4 = 2:1 | 10 | 1 | $0.9 \times 10^{-10}$ | 0.02 |
| Comparative Example 1 | None | 0 | 0.99 | $4.9 \times 10^{-10}$ | 0.13 |
| Comparative Example 2 | $C_{60}$ Only | 10 | 1 | $0.9 \times 10^{-10}$ | 0.88 |
| Comparative Example 3 | $C_{60}$:Compound 6 = 2:1 | 10 | 0.97 | $0.9 \times 10^{-10}$ | 1.83 |
| Comparative Example 4 | $C_{60}$:Compound 7 = 2:1 | 10 | 1 | $5.1 \times 10^{-10}$ | 0.02 |
| Comparative Example 5 | $C_{60}$:Compound 8 = 2:1 | 10 | 1 | $16.1 \times 10^{-10}$ | 0.06 |
| Comparative Example 6 | $C_{60}$:Compound 9 = 2:1 | 10 | 1 | $8.1 \times 10^{-10}$ | 0.02 |
| Comparative Example 7 | $C_{60}$:Compound 10 = 2:1 | 10 | 1 | $7.6 \times 10^{-10}$ | 0.04 |
| Comparative Example 8 | $C_{60}$:Compound 11 = 2:1 | 10 | 0.98 | $1.1 \times 10^{-10}$ | 1.68 |

TABLE 2-continued
|  | Composition of Hole Blocking Layer | Thickness of Hole blocking Layer (nm) | Relative Sensitivity | Dark Current (A/cm$^2$) | Light Response Speed (%) |
|---|---|---|---|---|---|
| Comparative Example 9 | C$_{60}$:Compound 12 = 2:1 | 10 | 0.97 | 8.9 × 10$^{-10}$ | 1.74 |
| Comparative Example 10 | C$_{60}$:Compound 13 = 2:1 | 10 | 0.97 | 8.5 × 10$^{-10}$ | 1.88 |
Compound 6
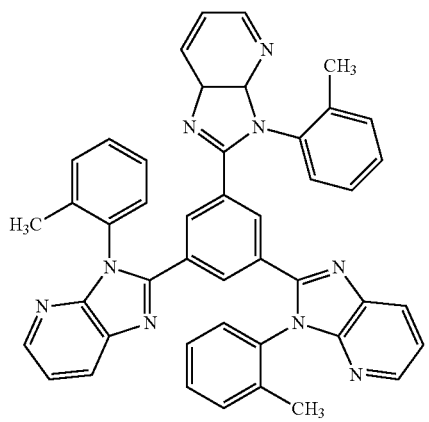
Compound 7
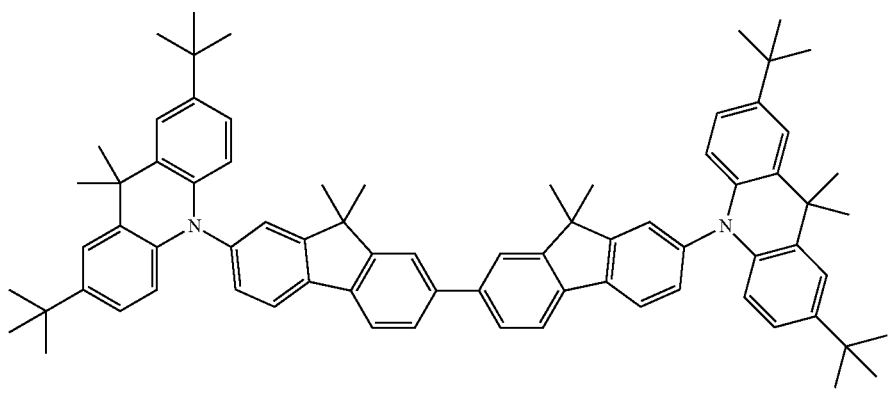
Compound 8
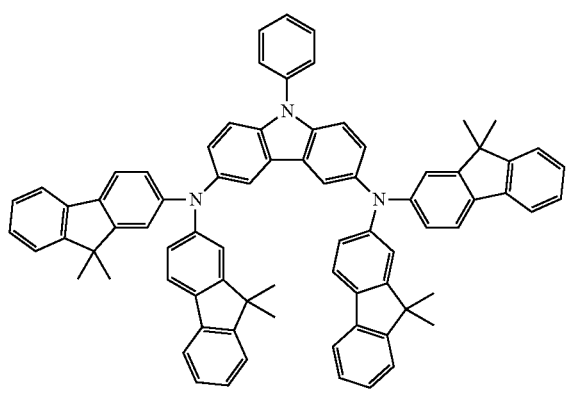
Compound 9
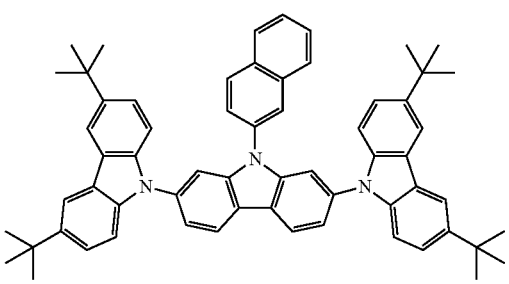

-continued

Compound 10

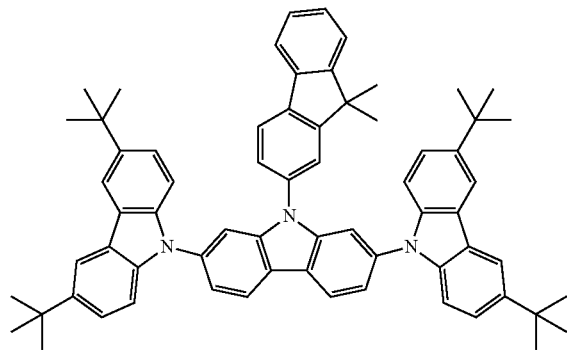

Compound 11

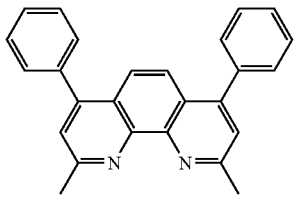

Compound 12

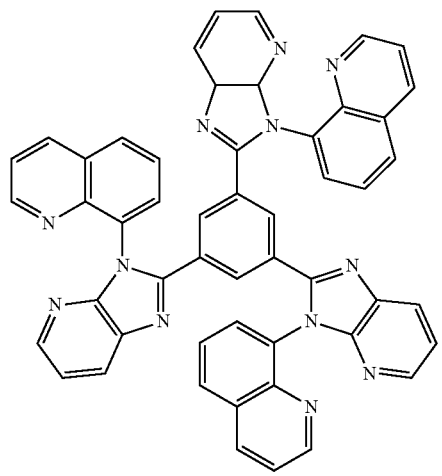

Compound 13

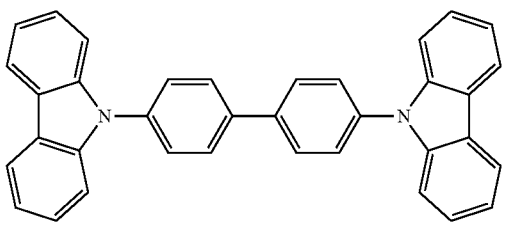

What is claimed is:

1. An organic photoelectric conversion device having a pair of electrodes and a light receiving layer which includes at least a photoelectric conversion layer and is sandwiched by the pair of electrodes, the device comprising:
  an electron blocking layer provided between the photoelectric conversion layer and one of the electrodes; and
  a hole blocking layer provided between the photoelectric conversion layer and the other of the electrodes,
  wherein the hole blocking layer is a layer that includes a fullerene and/or a fullerene derivative and a transparent hole transport material having an ionization potential greater than or equal to 5.5 eV and less than or equal to 5.8 eV.

2. The photoelectric conversion device as claimed in claim 1, wherein the hole blocking layer includes the fullerene and/or the fullerene derivative with a content of 30 vol% to 80 vol %.

3. The photoelectric conversion device as claimed in claim 2, wherein the content is 50 vol % to 75 vol %.

4. The photoelectric conversion device as claimed in claim 1, wherein the hole blocking layer has an average layer thickness of 5 nm to 100 nm.

5. The photoelectric conversion device as claimed in claim 4, wherein the hole blocking layer has an average layer thickness of 10 nm to 20 nm.

6. The photoelectric conversion device as claimed in claim 1, wherein the photoelectric conversion layer is a bulk hetero layer in which a p-type organic material and an n-type organic material are mixed.

7. The photoelectric conversion device as claimed in claim 1, wherein the photoelectric conversion layer includes a fullerene and/or a fullerene derivative.

8. The photoelectric conversion device as claimed in claim 1, wherein the electrode on the hole blocking layer side is a transparent electrode disposed on the light receiving side.

9. The photoelectric conversion device as claimed in claim 1, wherein the value obtained by dividing a voltage applied to the pair of electrodes from outside by a distance between the pair of electrodes is $1\times10^5$ V/cm to $1\times10^7$ V/cm.

10. An imaging device, comprising:
  a plurality of the photoelectric conversion devices as claimed in claim 1; and a circuit substrate on which is formed a signal readout circuit that reads out a signal according to a charge generated in the photoelectric conversion layer of the photoelectric conversion device.

* * * * *